United States Patent [19]
Tracy

[11] Patent Number: 5,677,853
[45] Date of Patent: Oct. 14, 1997

[54] PRODUCT TESTING BY STATISTICAL PROFILE OF TEST VARIABLES

[75] Inventor: Terry Alan Tracy, Kokomo, Ind.

[73] Assignee: Delco Electronics Corp., Kokomo, Ind.

[21] Appl. No.: 340,577

[22] Filed: Nov. 16, 1994

[51] Int. Cl.⁶ .................. G01R 31/00; G01R 31/02; G01N 25/72

[52] U.S. Cl. .................. 364/554; 374/4; 374/5; 324/500; 324/522; 324/527

[58] Field of Search ................ 364/554, 507, 364/508, 552, 154, 580; 324/523, 500, 522, 527, 760; 371/27, 28; 374/4, 5, 57, 46, 47, 48, 49, 51; 356/237; 73/865.6, 808, 809

[56] References Cited

U.S. PATENT DOCUMENTS

| | | | |
|---|---|---|---|
| 3,889,188 | 6/1975 | Trindade | 324/158 T |
| 3,898,561 | 8/1975 | Leighton, Sr. | 324/158 R |
| 3,916,306 | 10/1975 | Patti | 324/73 R |
| 4,722,062 | 1/1988 | Breitkopf et al. | 364/508 |
| 4,791,364 | 12/1988 | Kufis et al. | 324/158 F |
| 4,812,750 | 3/1989 | Keel et al. | 324/158 F |
| 4,855,897 | 8/1989 | Shinskey | 364/148 |
| 4,945,302 | 7/1990 | Janum | 324/73.1 |
| 5,030,905 | 7/1991 | Figal | 324/158 R |
| 5,187,432 | 2/1993 | Bauernfeind et al. | 324/158 R |
| 5,318,361 | 6/1994 | Chase et al. | 374/57 |
| 5,408,405 | 4/1995 | Mozumder et al. | 364/151 |

*Primary Examiner*—James P. Trammell
*Assistant Examiner*—Tony M. Cole
*Attorney, Agent, or Firm*—Mark A. Navarre

[57] ABSTRACT

An electronic product is tested for reliability by selecting test variables, determining the range and time dependent parameters of variables in consumer usage, randomly selecting a series of values from a statistical distribution which resembles typical usage experience of each variable, randomly selecting values from a statistical distribution of the time dependent parameters for each variable to determine a schedule for each test variable so that the selected values and schedule determine a profile of each variable, and simultaneously applying the variable conditions to the product according to the profiles for a time equivalent to the expected product life.

15 Claims, 4 Drawing Sheets

PRODUCT TESTING BY STATISTICAL PROFILE OF TEST VARIABLES

FIELD OF THE INVENTION

This invention relates to product testing by applying stress variables, and in particular to such testing using variable profiles which are statistically derived and which emulate typical usage.

BACKGROUND OF THE INVENTION

To test products for reliability and durability in a test period much shorter than the expected life of the product it has been common practice of most manufacturers or other test laboratories to submit the product to test cycles of extreme conditions. It was expected that any failure mechanism of a product would more likely be revealed under such extreme stresses than under moderate stresses. In practice, this expectation has been borne out in part. It has been discovered, however, that certain failure mechanisms were triggered by normal usage rather than the extreme test conditions.

In testing electronic products, reliability test environments have typically included some form of operating power cycling and temperature cycling. The operating power was set to a nominal voltage level, the voltage being switched on and off at some cyclical period, and the product was connected to typical or worst case loads. Simultaneously the product was exposed to a temperature environment which cycled in a repetitive manner between the worst expected cold temperature and the worst expected hot temperature.

At one period in the past, the test results correlated well with respect to acceleration and failure mechanisms experienced in the field warranty repairs. Later, as the failure mechanisms were identified and then corrected by product design improvements, the test acceleration and correlation became less robust. Field failures not detected by the standard tests were being revealed by environmental tests for which time and reliability were not a factor. Accordingly a new reliability test was needed.

SUMMARY OF THE INVENTION

It is therefore an object of the invention to improve the ability of product testing to reveal failure mechanisms related to normal usage. Another object is to test the reliability of a product subject to typical usage rather than test for failures induced by extremes of test variables.

A common teaching on testing methods is to simultaneously expose the product to multiple environmental extremes for a time period equivalent to the expected product life. The present invention departs from that teaching by recognizing that the product is not typically exposed to the environmental extremes and very seldom to simultaneous environmental extremes instead, it is proposed to test products by employing random distribution of environmental occurrences within the bounds of the extremes. Further, it is recognized that by focusing on the norms of usage rather than extreme conditions, the failures experienced in normal use are more likely to be exposed by the testing. The prior tenets of simultaneous exposure to multiple environmental stresses and testing for a time period equivalent to the expected product life are adapted to the random testing program.

A starting place of the proposed product testing is to obtain data on normal usage. Collecting information from many users on the frequency of use, the term of each use, and the conditions experienced by the product during use and between uses, for example. Some of the conditions to be considered are temperature, humidity, vibration, voltage, or pressure. The variables selected for the test are generally those which are expected to stress the product to excite failure mechanisms. It should be noted that environmental variables are not the only sources of stress but that operational loading of a product is also a variable subject to consider in designing a test.

In testing an electronic product for automotive application, applied voltage and the ambient temperature are used as an example of test variables. Realistic limits and profiles of the variables are needed to determine specific test conditions. The temperatures to which vehicles in the intended market area, say, North America, are known from weather studies showing the distributions of thermal occurrences throughout that continent. Such thermal data is refined according to vehicle sales patterns to provide sales-weighted statistical distributions of thermal highs and lows. Studies conducted of instrumented customer-owned vehicles reveal usage patterns. This would include data on how often vehicles are normally operated and for how long. Beginning with such data, voltage and thermal test profiles are constructed.

A table representing the voltage profile is constructed by building columns of ignition voltage, on time for each voltage and off time between voltage applications, and the table is long enough to represent usage for the product life, say 10 years. The voltages and on times are statistically chosen to simulate actual usage conditions. The off times are selected to be short in order to compress the test time but on average are long enough to permit thermal recovery from the effects of voltage during the on times. In this manner each year of normal usage is emulated in 22 days of testing. To construct the table, a set of data representing a normal distribution of ignition voltage is generated, using the nominal ignition voltage of 14 volts as the mean, and voltage values are randomly selected from the data set to form a column in the table. An on time for each of the voltages is determined by generating a gamma distribution of times which is a fair simulation of actual usage periods in the survey, and times are randomly selected from that distribution to fill another column in the table. Finally, an off time gamma distribution is generated and values are randomly selected from that to fill another column. Thus the table of voltages and the time schedule comprise a statistically derived voltage profile which is realistically related to normal product usage, and product testing proceeds by applying the ignition voltage to the product according to the profile.

For thermal testing a temperature profile is generated in a similar manner; a table is constructed according to a statistically derived simulation of normal usage conditions within a range of expected temperatures. The table includes columns of target temperatures, ramp rates for change from each temperature to the next, and dwell time at each temperature. To select temperature values, three sets of temperature distributions are generated for cold, medium and hot temperatures, respectively, to cover the expected temperature range with lower occurrence near the extremes. A column of temperatures is constructed by random selection from the three sets. An increased probability of selection from the hot set is provided to allow for the heating effect of high under-hood temperature on the product. Since ambient temperatures vary according to the time of day, a time-of-day dependent variable is added to the temperature column to afford a target temperature column. Ramp rates are randomly selected from a log-normal distribution of values to construct a ramp rate table; the log-normal distribution emphasizes low ramp rates. Estimates of the normal range of ramp rates and the emphasis on low ramp rates are based on engineering studies. A ramp time table is calculated based on the difference of adjacent target temperatures and the ramp rate. A column of dwell times is determined by a random selection from a gamma distribution of dwell times which is analogous to the voltage on times and is determined from usage data. A total time is accumulated from combined ramp times and dwell times. Thus the list of target temperatures along with the schedule of ramp rates and dwell times is the temperature profile used to control the temperature variable during product testing.

The test of an electronic product comprises a large array of like products in a test chamber equipped to supply the necessary voltages and air temperatures. In the case of a microprocessor product a continuous voltage is applied to maintain its memory function and a switched ignition voltage supplies its operating energy. Input signals and an output load are provided to exercise the product during the test, and the outputs are monitored to detect product failure. The switched ignition voltage is varied according to the voltage profile and the cheer air temperature is varied according to the temperature profile. When each year equivalent of usage is completed, as determined by the voltage profile, the tables are recalculated using the same calculations as before, resulting in different specific test variable values due to the random selection, and the test is continued into the next year equivalent.

The statistically derived test variables impact the product with a wide variety of stress conditions for each variable which seldom reach extreme conditions but are realistically focused on the range of normal usage, and therefore provoke failures of the kind experienced in normal usage.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
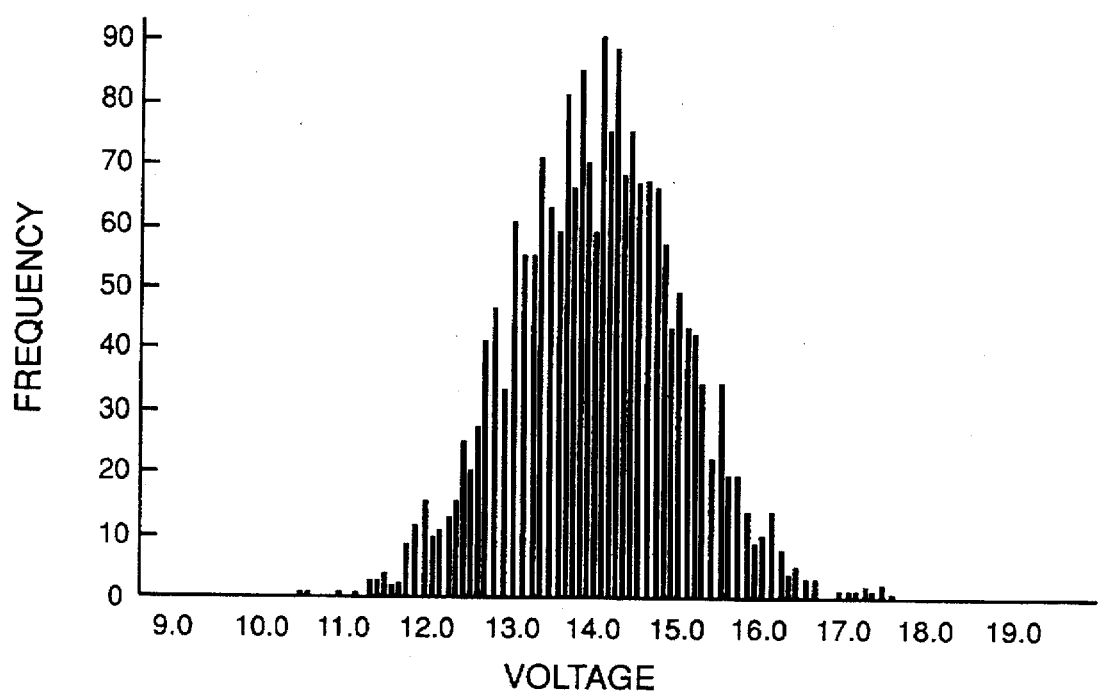
FIG. 1 is a graph of voltage value distribution randomly selected from a normal voltage distribution.

The ensuing description is directed to an environmental reliability test of an automotive engine control module using vehicle ignition voltage and ambient temperature as the test variables. While the module is an electronic product, the failure mechanisms are mechanical, such as material creep or fatigue. Thus the test method using statistical profiles of test variables is not limited to electronic products but extends to mechanical products as well. Further, even though environmental variables are those causing stresses affecting reliability in this example, the loads on the product may be used as the test variables.

An environmental test on an electronic product such as an engine control module requires a test chamber accommodating a large number of the products and facilities for controlling the test variables according to a test schedule. In this case the test variables are ignition voltage and temperature. During the test the modules are connected to typical loads, electrical input signals are coupled to the modules to exercise them, and the loads are monitored to determine whether any failure occurs.

Profiles of voltage and temperature variables are developed by monitoring or surveying the usage of the products in the field and by employing temperature data throughout the intended market area of the product to assess the pattern of each variable. Thus the normal ranges of the value of each variable and its frequency and duration are determined. Then by statistically generating distributions of the variables and randomly selecting values from each distribution, a profile of each variable is generated which emulates typical usage. The distribution of variables includes extremes but the major population of each distribution is nearer the mean or commonly used region. Each profile includes a list of variable values and a schedule of application of each variable.

A convenient way of generating variable profiles is by a computer having a spreadsheet program with the capability of generating statistical distributions. For example, a Lotus 1-2-3 (TM) spreadsheet coupled with a @RISK (TM) program available from Palisade Corporation, 31 Decker Road, Newfield, N.J., which can develop customized and random probability distributions. For each parameter of a variable a normal, gamma, or other suitable distribution is generated and tailored to reflect the pattern of actual usage, and values are randomly selected from the distribution and compiled in a table. Each table includes a list of variable values and a schedule for applying the variables, the list and schedule together comprising the profile. Table I is the beginning and end of the voltage profile for the engine control module for a one year equivalent test. The table includes the total on time of the test. According to usage data, an automobile is operated for an average of 360 hours per year. The one year equivalent test is carried out in 22 days. The time compression or acceleration is due to the foreshortened off times.

TABLE I

| Step | Voltage | On Time Minutes | Off Time Minutes | Total On Hours |
| --- | --- | --- | --- | --- |
| 1 | 15.4 | 8.1 | 2.9 | 0.1 |
| 2 | 15.1 | 18.4 | 4.6 | 0.4 |
| 3 | 13.1 | 8.7 | 2.0 | 0.6 |
| 4 | 15.6 | 4.9 | 10.1 | 0.7 |
| 5 | 14.4 | 18.9 | 4.9 | 1.0 |
| ... | — | — | — | — |
| 2024 | 13.8 | 5.5 | 9.2 | 359.9 |
| 2025 | 14.2 | 3.7 | 1.7 | 359.9 |
| 2026 | 12.7 | 1.1 | 4.3 | 360.0 |

Figure 2:
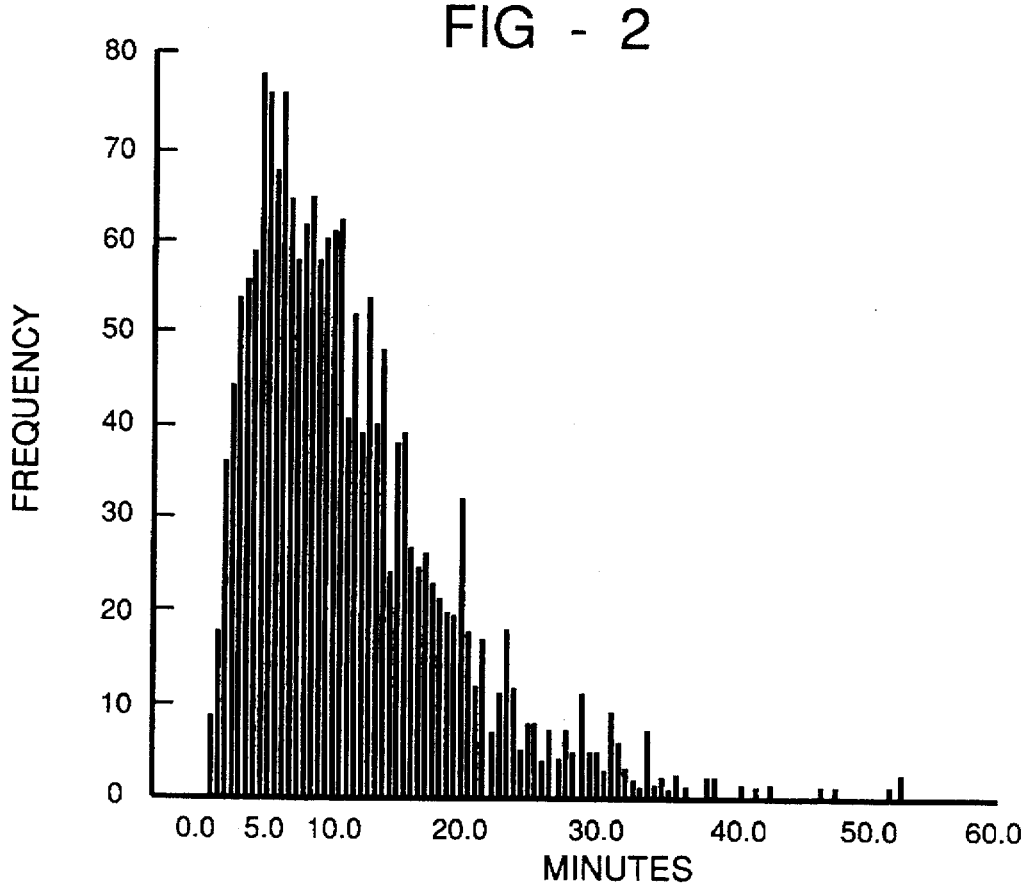
FIG. 2 is a graph of voltage on time distribution randomly selected from a gamma distribution of on time.
Figure 3:
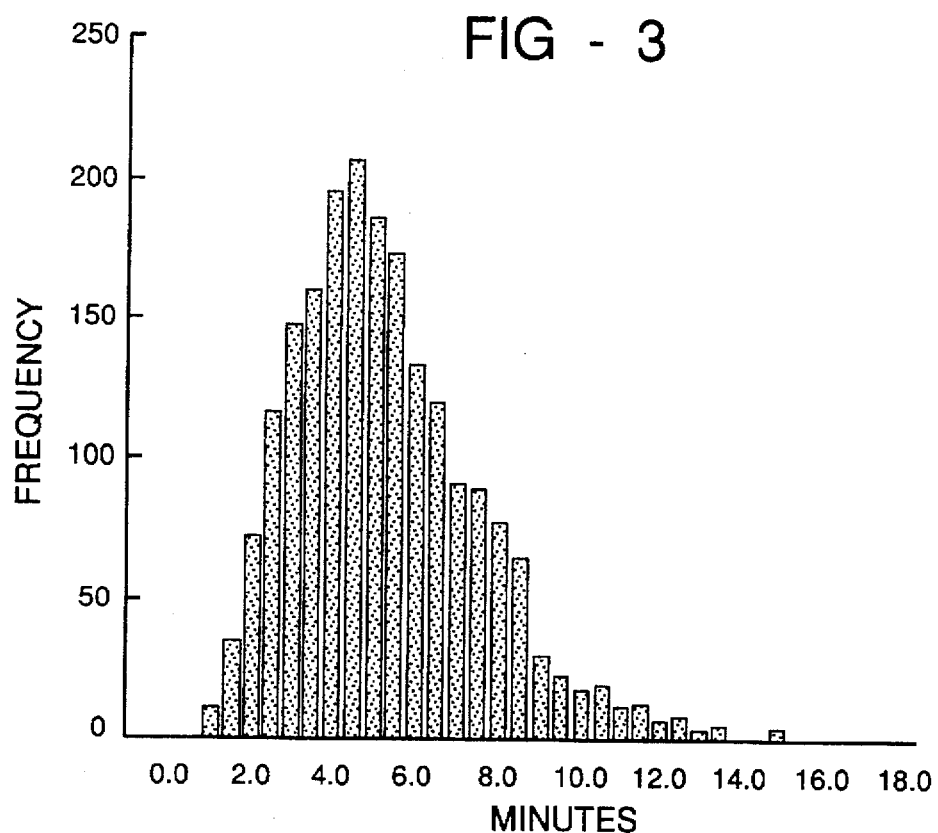
FIG. 3 is a graph of voltage off time distribution randomly selected from a gamma distribution of off time.

The voltage values in the table are based on product usage information that the ignition voltage is nominally at 14 volts but varies between 10.5 and 17.5 volts. The voltage for each step is randomly selected from a normal distribution having a mean value of 14 volts and having a variation of 1 volt. FIG. 1 is a graph of frequency of each voltage value for the one year equivalent test. Typical on time ranges from a few second to nearly an hour with a mean time of 10.7 minutes. The on times are randomly selected from a gamma distribution of times having a mean of 10.7 minutes and a tail shaped to allow for a singular occurrence approaching 60 minutes. FIG. 2 shows the on time frequency for the one year equivalent test. Off times can range up to several hours or several days, but the effect of off time can be simulated by a mean off time of 5 minutes and ranging from 0.5 minute to 16 minutes. The 5 minute off time is sufficient to allow cooling of the silicon chips of a module and thereby to realize the effects of thermal cycling. The off time values are randomly selected from a gamma distribution having a mean value of 5 minutes and a tail shaped to allow for a singular occurrence approaching 16 minutes. The distribution of off times is shown in FIG. 3.

The thermal profile for the environmental test represents the thermal experience of the product due to the ambient weather, vehicle application, and customer usage. The profile is developed by generating a temperature list randomly selected from a distribution covering cold, moderate and hot conditions and selecting random temperatures, an adjustment to the selected temperatures to reflect diurnal temperatures changes as a function of the time of day, a randomly selected ramp rate for change from each temperature to the next, a calculation of the ramp time, and a randomly selected dwell time. These parameters are shown in Table II for the first few step of the thermal profile. The length of the table for a year equivalent test is controlled by the 22 day period required to run the voltage profile and the cumulative total time of the thermal steps. The temperatures are expressed in degrees Celsius.

TABLE II

| Thermal Step | Start Temp | Selected Temp | Diurnal Target Temp | Ramp Rate | Ramp Time | Dwell Time |
| --- | --- | --- | --- | --- | --- | --- |
| 1 | 25 | 56 | 56 | 2.7 | 11.5 | 33.13 |
| 2 | 56 | 27 | 30 | 6.0 | 4.3 | 14.49 |
| 3 | 30 | 22 | 26 | 0.6 | 7.7 | 15.92 |
| 4 | 26 | −9 | −4 | 1.5 | 19.6 | 20.90 |
| 5 | −4 | 24 | 31 | 0.3 | 120.6 | 47.07 |
| 6 | 31 | 35 | 48 | 18.7 | 0.9 | 48.98 |
| 7 | 48 | −21 | −8 | 0.3 | 164.3 | 12.69 |
| 8 | −8 | 79 | 89 | 1.3 | 76.6 | 15.92 |
| 9 | 89 | −22 | −16 | 0.4 | 266.1 | 6.75 |

The start temperature column begins at room temperature and for each succeeding step the start temperature is the target temperature of the previous step. The selected temperature is determined by generating three columns (not shown) for cold, moderate and hot temperatures. Each cell in the cold temperature column is a random number selected from a truncated normal distribution having a mean of −10° C., a variation of 7° C. and truncated tails at −40° C. and 25° C. Each cell in the moderate temperature column is a random number selected from a truncated normal distribution having a mean of 25° C., a variation of 7° C. and truncated tails at −10° C. and 70° C. Each cell in the moderate temperature column is a random number selected from a reversed gamma distribution having a mean of 70° C., a maximum of 105° C. and shape factor which allows the tail to extend downward to 25° C.

Figure 4:
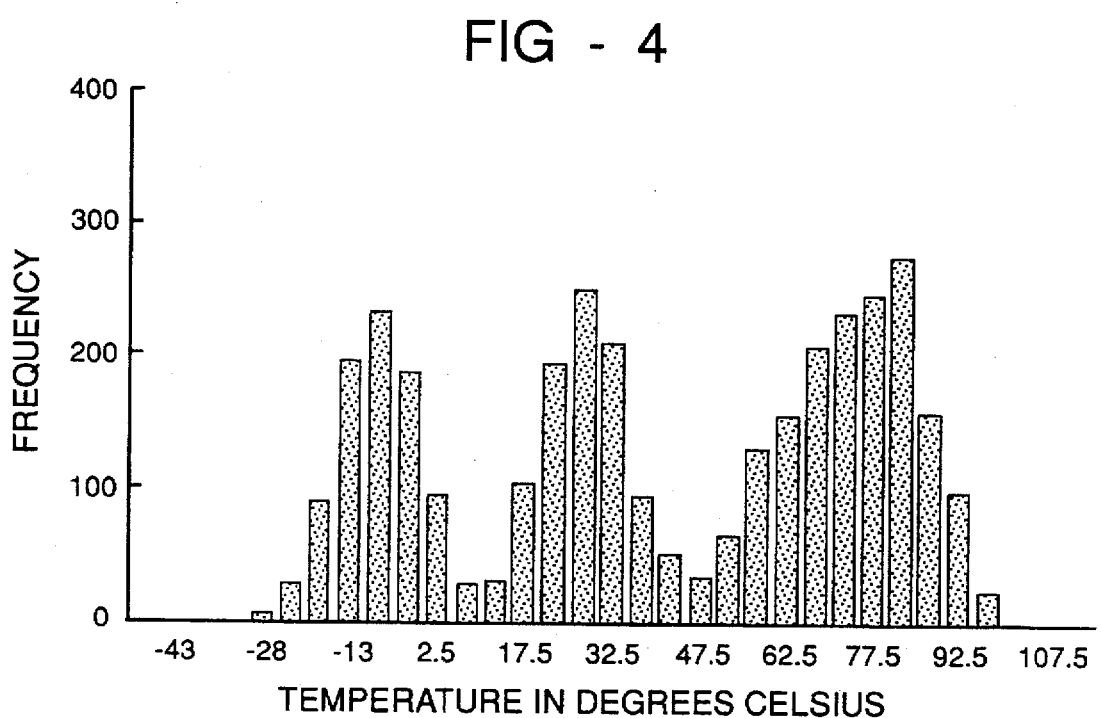
FIG. 4 is a graph of temperature distribution randomly selected from statistically derived tables of expected temperatures.

The selected temperature is then chosen from the cold, moderate and hot temperature column with probabilities of 25%, 25% and 50%, respectively. This provides a bias toward hot temperatures which is consistent with underhood thermal heating. This method of temperature selection also provides a fairly uniform distribution (especially after diurnal temperature adjustment) with reduced frequency at the temperature extremes. FIG. 4 shows the selected temperature distribution for a one year equivalent test.

Figure 5:
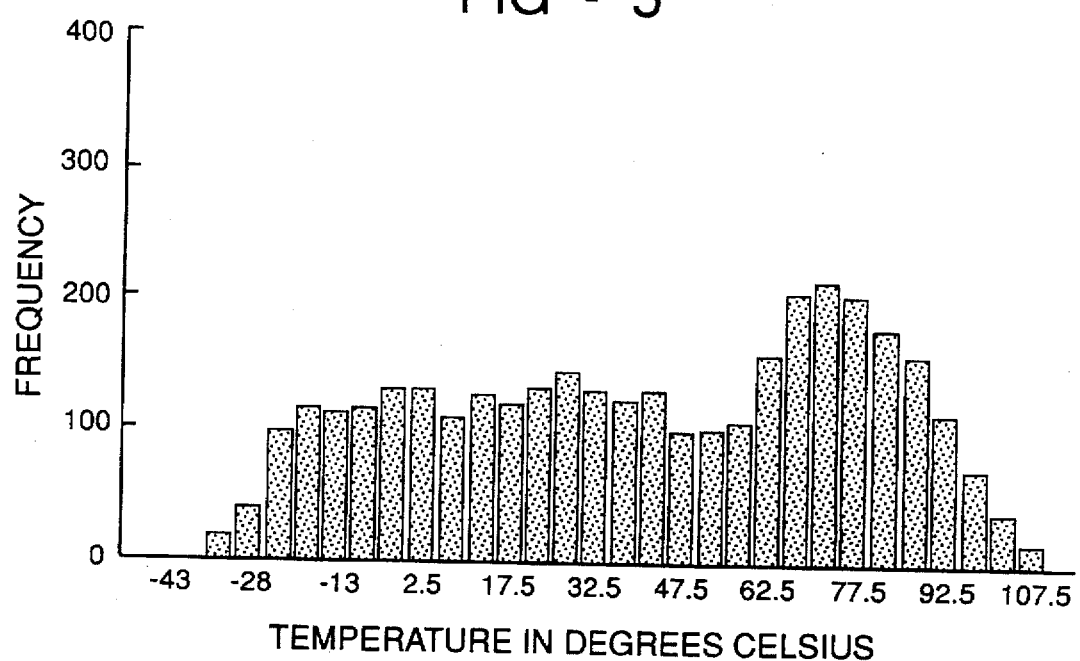
FIG. 5 is a graph of diurnally adjusted temperature distribution.

A time dependent variable number is added to the selected temperature which represents the temperature variation typically experienced throughout each day. This diurnally adjusted value is the actual target temperature for each thermal step profile and also the starting temperature for the next thermal step. FIG. 5 shows the diurnally adjusted target temperature distribution.

Figure 6:
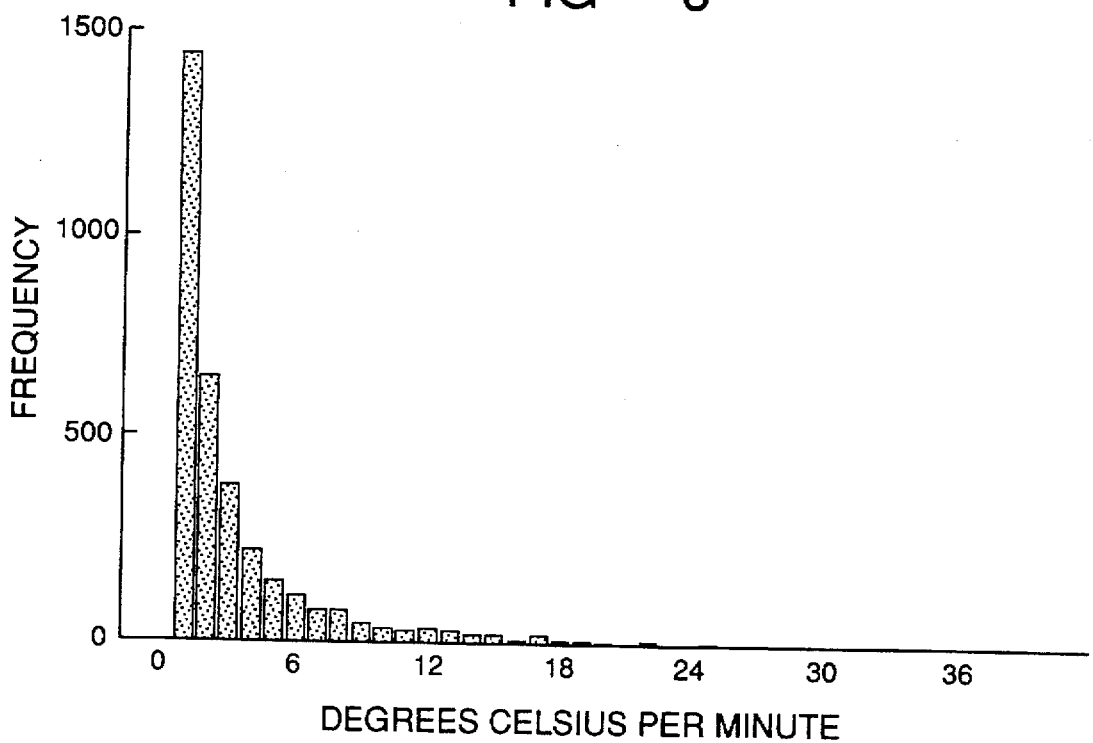
FIG. 6 is a graph of thermal ramp rate distribution randomly selected from a log-normal distribution of ramp rate.

A ramp rate column displays the thermal ramp rate to be achieved between the start temperature and the diurnal target temperature. Each value is a random number selected from a truncated log-normal distribution having a mean of 12° C. per minute, a variation of 4° C. per minute and truncated tails at 0.1° C. per minute and 40° C. per minute. The resulting ramp rate distribution is shown in FIG. 6. The ramp time for each step is calculated from the difference between each starting temperature and the target temperature, and the ramp rate.

The thermal step dwell time is the time that the target temperature is maintained once reached before the next thermal step begins. Each dwell time value is a random number independently selected from a gamma distribution having a mean of 30 minutes and a shaping factor which allows the tail of the distribution to reach near 90 minutes.

The thermal profile is used to control the temperature of the test chamber during the time that the voltage applied to the products is being varied according to the voltage profile. Each 22 days of testing is equivalent to one year of field use, and the test is extended to additional years to calculate new voltage and temperature profiles for each successive year using the methods just described.

The method of testing products by variables which are statistically derived profiles to simulate normal usage is then able to reveal failures consistent with those found in normal usage. These tests reveal failures or failure mechanisms which are not revealed by prior test procedures which chiefly employ the extremes of use conditions.

Figure 7:
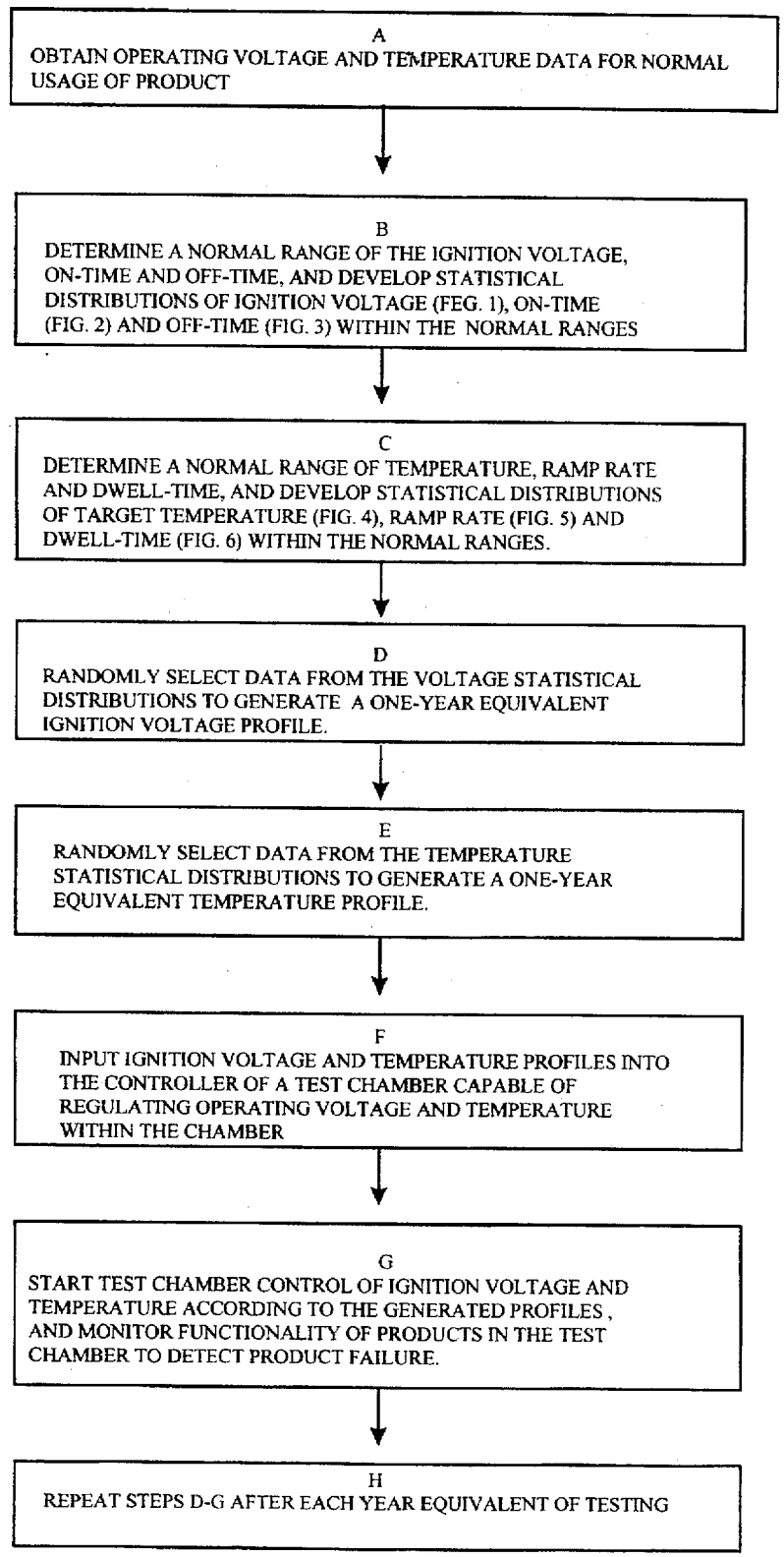
FIG. 7 is a process flow diagram for carrying out a product testing regimen in accordance with this invention.

The process flow diagram of FIG. 7 summarizes the above-described test method for a product subjected to statistically derived profiles for both operating voltage and temperature.

The embodiments of the invention in which an exclusive property or privilege is claimed are defined as follows:

1. A method of testing an electronic product in a variable voltage and variable temperature environment comprising the steps of:

establishing a statistically varying voltage profile including, statistically selecting a series of voltage values from a normal distribution of voltage values to simulate actual usage conditions, and statistically scheduling each selected voltage value;

establishing a statistically varying thermal profile including, statistically selecting temperatures from a discrete distribution of temperature values, determining target temperatures based on the statistically selected temperatures, and statistically selecting thermal ramp rates for changes between adjacent selected target temperatures; and testing the product while applying voltages according to the established voltage profile and simultaneously applying temperatures according to the established thermal profile.

2. The invention as defined in claim 1 wherein the step of establishing a statistically varying thermal profile further includes statistically selecting dwell times for holding the selected target temperatures prior to changing to a subsequent target temperature.

3. The invention as defined in claim 1 wherein determining target temperatures comprises adding a variable to each selected temperature wherein the variable is a function of the time of day.

4. The invention as defined in claim 1 wherein statistically selecting temperatures from a discrete distribution of temperature values comprises:

generating tables of discrete temperature distributions for different temperature ranges; and randomly selecting temperature values from the tables.

5. The invention as defined in claim 1 wherein statistically selecting temperatures from a discrete distribution of temperature values comprises:

generating tables of discrete temperature distributions for cold, moderate and hot temperature ranges; and randomly selecting a temperature value from the tables with a preferred probability of selection from the hot range.

6. The invention as defined in claim 1 wherein statistically selecting a series of voltage values comprises randomly selecting from a normal distribution of voltage values about a mean value.

7. The invention as defined in claim 1 wherein statistically selecting a series of voltage values comprises:

determining a mean value and a normal range of voltage values during customer usage;

calculating a normal distribution of voltage values based on the normal range and mean value; and randomly selecting from the normal distribution of voltage values.

8. The invention as defined in claim 1 wherein statistically scheduling each voltage value comprises:

statistically determining a series of on times for successive voltage values: and statistically determining a series of off times defining intervals between voltage values.

9. The invention as defined in claim 8 wherein statistically determining a series of on times for successive voltage values comprises:

determining a mean value and a normal range of on times during customer usage;

calculating a statistical distribution of on times based on the normal range and mean value; and randomly selecting from the statistical distribution of on times.

10. A method of testing a product under varying stress conditions comprising the steps of:

a. selecting a stress variable;

b. determining a normal range of the variable during product usage;

c. determining a statistical distribution of values within the normal range;

d. randomly selecting a series of values from the distribution to simulate actual usage conditions;

e. randomly scheduling the values of the selected series in a timed sequence, whereby the timed sequence of the selected values comprises a profile of the stress variable; and f. testing the product by applying the stress variable to the product according to the profile of the variable.

11. The invention as defined in claim 10 further including the steps of:

selecting a second stress variable;

statistically determining a profile of the second variable by performing the steps b through e of claim 10 for the second variable;

and wherein the step of testing the product includes simultaneously applying both stress variables to the product each according to its profile.

12. The invention as defined in claim 10 wherein the stress variable is temperature and the step of randomly scheduling the values of the selected series in a timed sequence comprises:

selecting ramp rates for changes between adjacent selected temperatures; and selecting dwell times for holding each selected temperature before changing to another temperature;

whereby the time between temperature changes depends on the dwell time and the time required to make the change at the selected ramp rate.

13. The invention as defined in claim 12 wherein the ramp rates and dwell times are randomly selected from respective statistical distributions of ramp rates and dwell times.

14. The invention as defined in claim 10 wherein the product is an electrical product and the selected variable is a voltage, wherein the step of randomly scheduling the values of the selected series in a timed sequence comprises:

statistically determining a series of on times for successive voltage values: and statistically determining a series of off times defining intervals between voltage values.

15. The invention as defined in claim 10 wherein the product is an electrical product and the selected variable is a voltage, wherein the step of determining a statistical distribution of values comprises:

determining a mean voltage value during customer usage;

calculating a normal distribution of voltage values based on the normal range and mean value.

* * * * *